(12) United States Patent
Chang et al.

(10) Patent No.: US 7,768,359 B2
(45) Date of Patent: Aug. 3, 2010

(54) LOW PHASE NOISE DIFFERENTIAL CRYSTAL OSCILLATOR CIRCUIT

(75) Inventors: Yuyu Chang, Irvine, CA (US); Hooman Darabi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 34 days.

(21) Appl. No.: 12/241,101

(22) Filed: Sep. 30, 2008

(65) Prior Publication Data

US 2010/0026402 A1    Feb. 4, 2010

Related U.S. Application Data

(60) Provisional application No. 61/085,665, filed on Aug. 1, 2008.

(51) Int. Cl.
*H03B 5/36* (2006.01)

(52) U.S. Cl. .................. 331/116 FE; 331/173; 331/185

(58) Field of Classification Search ............. 331/116 R, 331/116 FE, 158, 185, 182, 183, 172, 173
See application file for complete search history.

(56) References Cited

U.S. PATENT DOCUMENTS

| | | | |
|---|---|---|---|
| 6,377,315 B1 * | 4/2002 | Carr et al. | 348/726 |
| 6,696,899 B2 * | 2/2004 | Ruffieux | 331/154 |
| 6,956,443 B2 * | 10/2005 | Ruffieux | 331/158 |
| 2006/0049884 A1 * | 3/2006 | Kollmann | 331/158 |

* cited by examiner

*Primary Examiner*—Robert Pascal
*Assistant Examiner*—Ryan Johnson
(74) *Attorney, Agent, or Firm*—Garlick Harrison & Markison; Holly L. Rudnick (57) ABSTRACT

A differential crystal oscillator circuit uses a bias transistor to generate a bias voltage from a bias current. The bias voltage is supplied to the control terminals of a differential pair of transistors. The differential transistors operate to produce a differential output between corresponding end terminals thereof, which is provided to a reference crystal oscillator to establish an oscillation frequency at the differential output.

18 Claims, 6 Drawing Sheets

LOW PHASE NOISE DIFFERENTIAL
CRYSTAL OSCILLATOR CIRCUIT

CROSS REFERENCE TO RELATED PATENTS

The present U.S. Utility patent application claims priority pursuant to 35 U.S.C. §119(e) to the following U.S. Provisional Patent Application which is hereby incorporated herein by reference in its entirety and made part of the present U.S. Utility patent application for all purposes:

U.S. Provisional Application Ser. No. 61/085,665, entitled "LOW PHASE NOISE DIFFERENTIAL CRYSTAL OSCILLATOR CIRCUIT," filed Aug. 1, 2008.

STATEMENT REGARDING FEDERALLY
SPONSORED RESEARCH OR DEVELOPMENT

Not Applicable

INCORPORATION-BY-REFERENCE OF
MATERIAL SUBMITTED ON A COMPACT DISC

Not Applicable

BACKGROUND OF THE INVENTION

1. Technical Field of the Invention

This invention relates generally to oscillator circuits, and in particular, to crystal oscillator circuits.

2. Description of Related Art

Local oscillator signals used in cellular telecommunications applications must be both tunable and highly stable. A tunable frequency can be easily produced using an LC type oscillation circuit. However, LC oscillators typically do not have sufficient frequency stability for cellular applications. Therefore, crystal oscillators are often used to provide the necessary frequency stability. Crystals, such as quartz, have an extremely high Q, which leads to oscillators with very stable frequency values.

Typically, quartz crystals are cut and mounted to vibrate best at a desired resonant frequency or an overtone (multiple) of the desired resonant frequency. When the crystal is vibrating, the crystal can be modeled as an RLC circuit that produces a rapidly changing reactance with frequency, with the RLC circuit providing positive feedback and gain at the resonant frequency, leading to sustained oscillations. Although the crystal is designed to oscillate at its resonant frequency, in order to provide tunability, a circuit can be coupled to the crystal oscillator to "pull" the frequency of the crystal oscillator to a desired value.

The simplest form of a voltage-controlled crystal oscillator is a single-ended oscillator circuit, in which single-ended signals are used to initiate and maintain the crystal oscillations. However, single-ended designs often suffer from excessive noise due to interference from the substrate of the oscillator circuit and from the bonding wires coupled between the oscillator circuit and crystal. As a result, differential oscillator circuits are becoming more widely used in cellular applications due to their ability to suppress some of the noise.

Differential crystal oscillator circuits typically utilize a current source to provide the bias current to drive the differential oscillator circuit. However, in traditional differential designs, the flicker noise induced by the current source contributes significantly to the overall circuit phase noise (PN). Thus, it has been difficult to meet the stringent PN requirements (e.g., −150 dBc/Hz at 10 kHz offset) in cellular applications with traditional differential crystal oscillator designs.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
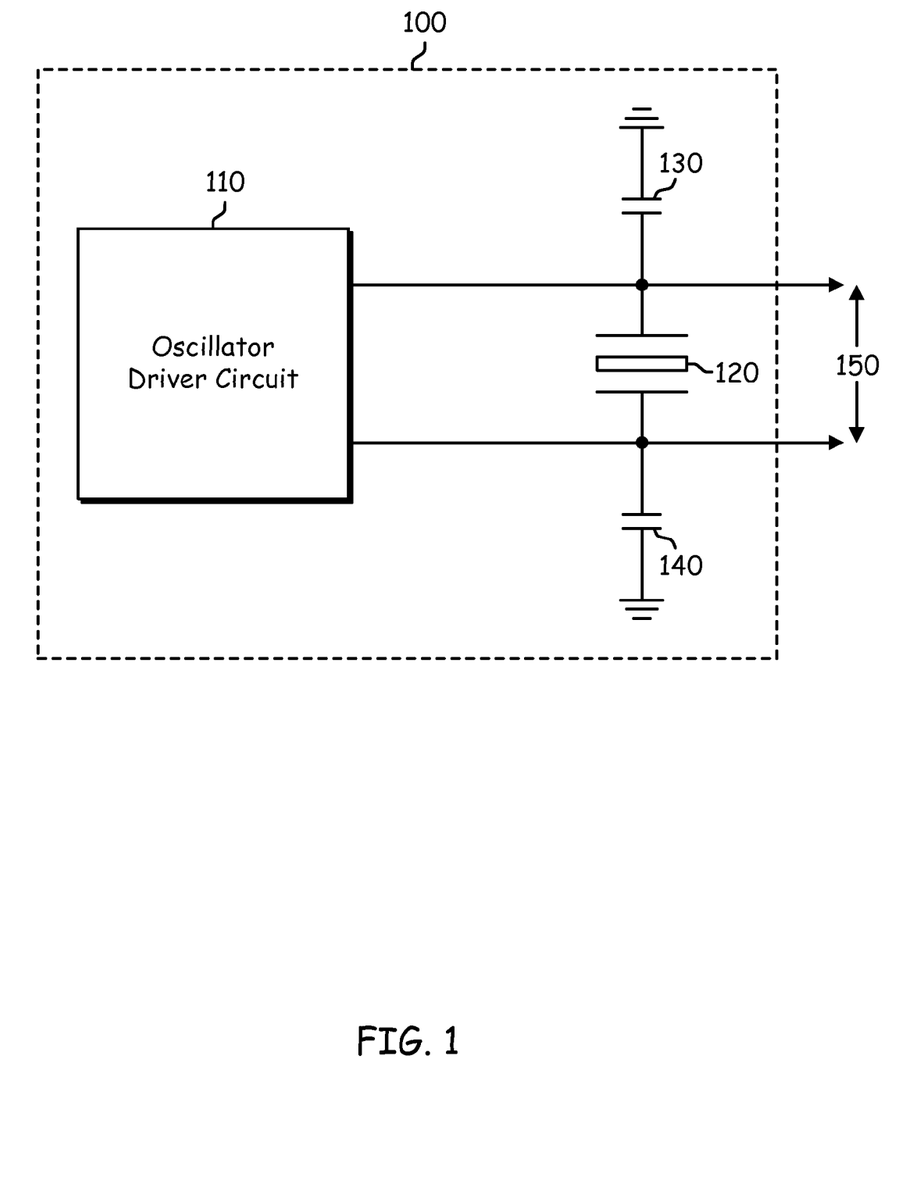
FIG. 1 is a schematic block diagram of a differential crystal oscillator in accordance with the present invention.

FIG. 1 depicts a simplified block diagram of an exemplary differential crystal oscillator circuit 100, in accordance with the present invention. The differential crystal oscillator circuit 100 includes a differential oscillator driver circuit 110, a resonating crystal 120 and a pair of load capacitors 130 and 140. The resonating crystal may be formed from a variety of resonating crystalline materials, including but not limited to, quartz and tourmaline. For example, in an exemplary embodiment, the resonating crystal is formed from a piece of quartz that is precisely cut, sized and shaped to resonate at a particular frequency.

The resonating crystal 120 is coupled between differential terminals of the differential oscillator drive circuit 110, and is preferably mounted off-chip from the differential oscillator drive circuit 110. Each of the load capacitors 130 and 140 is coupled between ground potential and one of the two symmetrical and differential output terminals of the resonating crystal 120 to shunt the output terminals of the resonating crystal 120 to ground.

In operation, the differential oscillator driver circuit 110 drives the resonating crystal 120 to oscillate at a particular frequency in order to define a sinusoidal and differential output signal 150 across the two symmetrical output terminals of the crystal 120. The sinusoidal and differential output signal 150 is suitable for use in various applications, such as phase locked loops, frequency tunable digital filters, direct digital frequency synthesizers, and the like.

The differential output signal 150 includes a pair of periodic sinusoidal signals, in which the signal at one of the output terminals is 180° out of phase with the signal at the other output terminal. As a result, when the differential output signal 150 is later converted back to a single-ended signal, any common mode noise injected into the terminals (e.g., power supply noise, on-chip or off-chip spur couplings, etc.)

will be canceled. However, phase noise may still be present in the output signal due to, for example, flicker noise in the oscillator driver circuit 110. In order to reduce the flicker noise, and hence the phase noise in the resulting output signal 150, in accordance with embodiments of the present invention, the oscillator driver circuit 110 can be designed as shown in FIG. 2.

Figure 2:
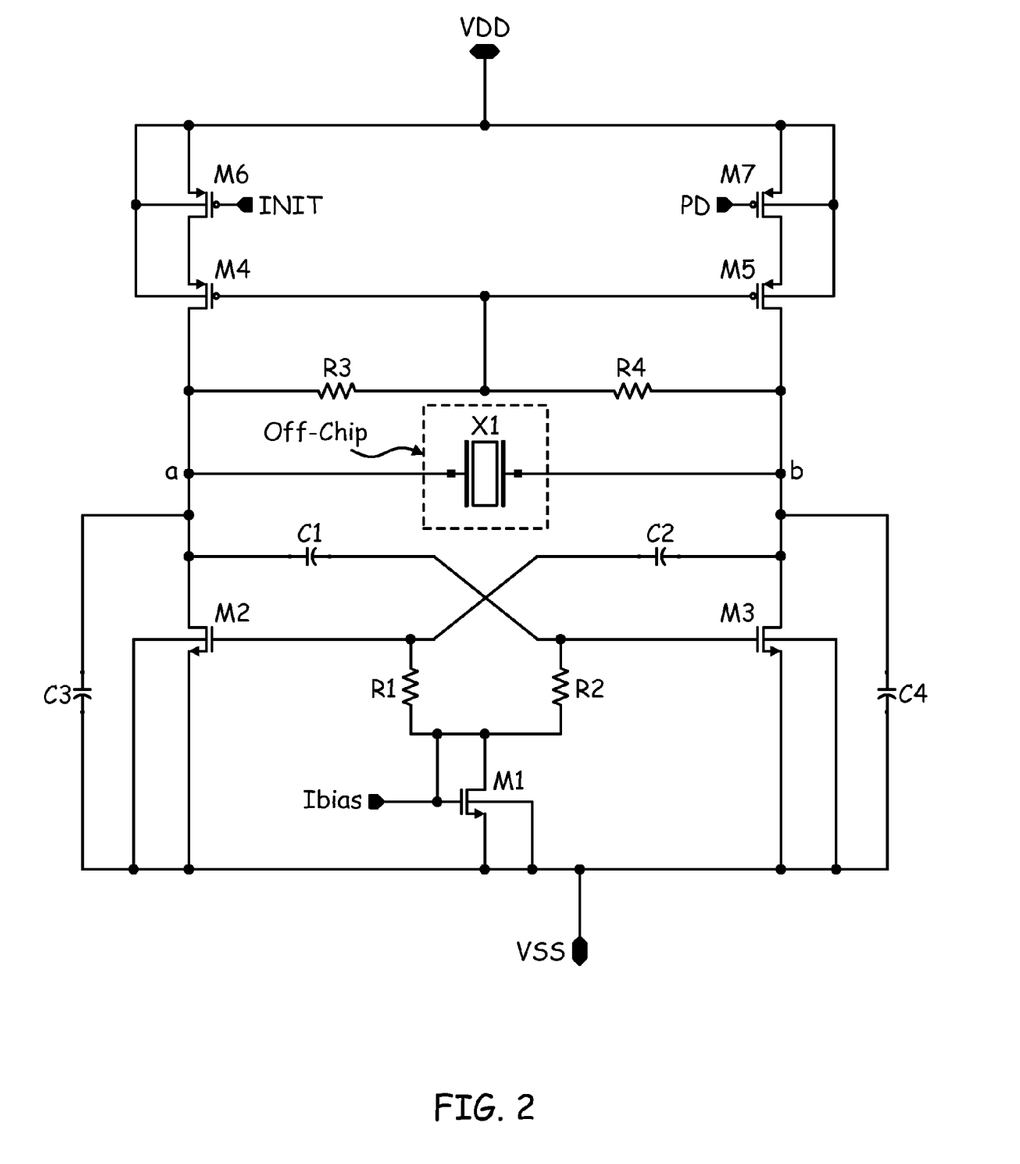
FIG. 2 is a simplified circuit diagram of a differential crystal oscillator in accordance with the present invention.

FIG. 2 depicts a simplified circuit diagram of an exemplary differential crystal oscillator circuit in accordance with the present invention. The differential crystal oscillator circuit includes a resonating crystal X1 and oscillator driver circuitry (corresponding to the oscillator driver circuit of FIG. 1). As indicated in FIG. 2, the resonating crystal X1 is off-chip from the differential oscillator driver circuitry. Therefore, interconnecting leads, extending from points a and b couple the differential output of the oscillator driver circuitry to the resonating crystal X1.

The differential oscillator driver circuitry is constructed using simple integrated circuit components that are symmetrical about a central axis. In particular, the differential oscillator driver circuitry includes a pair of N-type transistors M2 and M3 having their source terminals coupled in common and to a supply potential $V_{SS}$ (i.e., ground) and their gate terminals coupled to a bias source. In addition, the gate terminals of each of the transistors M2 and M3 are further coupled to the drain nodes of the opposite transistor, i.e., the gate terminal of transistor M2 is coupled to the drain node of M3, and vice-versa. As such, transistors M2 and M3 operate differentially by cross coupling the transistors M2 and M3 in order to provide feedback.

Output terminals are defined at the drain nodes of each of the transistors M2 and M3, with the drain node of transistor M2 defining the positive terminal and the drain node of transistor M3 defining the negative output to produce a differential output across nodes a and b that is provided to the resonating crystal X1 to drive the crystal X1 to oscillate at a desired frequency. Capacitors C3 and C4 operate to tune the oscillation frequency of the crystal X1. For example, by adjusting the capacitance values of C3 and C4, the oscillation frequency of the crystal oscillator X1 can be "pulled" from its resonant frequency to a particular desired frequency.

The bias source includes a current source Ibias providing a bias current and a N-type bias transistor M1 that generates a bias voltage in response to the bias current. The source terminal of the bias transistor M1 is coupled to ground and the gate terminal of the bias transistor M1 is coupled to the current source Ibias and is further coupled to the drain terminal of the bias transistor M1. Therefore, the gate and drain terminals of the bias transistor M1 are tied together in order to generate a bias voltage that is provided to the gate terminals of transistors M2 and M3. Using a single bias transistor M1 to generate the bias voltage to bias differential transistors M2 and M3 minimizes the flicker noise in the bias voltage, thereby reducing the phase noise of the overall differential crystal oscillator circuit to levels that are appropriate for use in cellular applications, i.e., phase noise levels better than −150 dBc/Hz at 10 kHz.

Since transistors exhibit some measure of gain at all frequencies, particularly DC, in order to remove the DC gain component in the output, high pass filters are interposed between the gate and output (drain) terminals of the differential transistors M2 and M3. Each high pass filter is implemented as an RC filter, each including a resistor R1 or R2 and a capacitor C1 or C2 in a series-parallel configuration. For example, a first high pass filter includes resistor R1 and capacitor C2, while a second high pass filter includes resistor R2 and capacitor C1. Capacitor C1 is series-connected between the drain terminal of transistor M2 and the gate terminal of transistor M3, while capacitor C2 is series-connected between the drain terminal of transistor M3 and the gate terminal of transistor M2.

In operation, the high pass filters filter the differential output prior to applying the filtered differential signals to the gates of the differential pair of transistors M2 and M3. In particular, the high pass filter of C1 and R2 operates to filter the output from M2 and provides the filtered output signal to the gate of M3. Likewise, the high pass filter of C2 and R1 operates to filter the output from M3 and provides the filtered output signal to the gate of M2. The frequency values set by R1, C2 and R2, C1 are chosen to be small enough such that they do not affect the resonant frequency of the crystal X1.

The differential oscillator driver circuit further includes a control circuit that functions to maintain a high impedance across the differential output of transistors M2 and M3. In particular, a pair of P-type transistors M4 and M5 is provided, each having its drain terminal coupled to a respective one of the differential output terminals of transistors M2 and M3. In addition, transistors M4 and M5 have their source terminals coupled in common and to a supply voltage, $V_{DD}$. In an exemplary embodiment, the supply voltage $V_{DD}$ is set to a low value, e.g., 1.2V.

The gate terminals of transistors M4 and M5 are tied together in common and are further coupled, in a feedback fashion, to each transistor's drain node through a respective bias resistor R3 and R4. In particular, the gate terminals of the P-type transistors M4 and M5 are coupled to a center tab between the resistors R3 and R4. This center tab defines a virtual ground that corresponds to a signal midpoint about which the sinusoidal differential output signals oscillate. Any common mode component present at the differential output will cause a voltage excursion to appear at the gates of the P-type transistors M4 and M5, which will cause M4 and M5 to adjust the operational characteristics of the differential oscillator drive circuit to minimize any common mode component.

The control circuit further includes an initializing transistor M6 and a power down transistor M7. The initializing transistor M6 operates to turn on the differential crystal oscillator circuit to enable the crystal X1 to begin oscillating. The power down transistor M7 operates to turn off the differential crystal oscillator circuit to stop the crystal X1 from oscillating.

Figure 3:
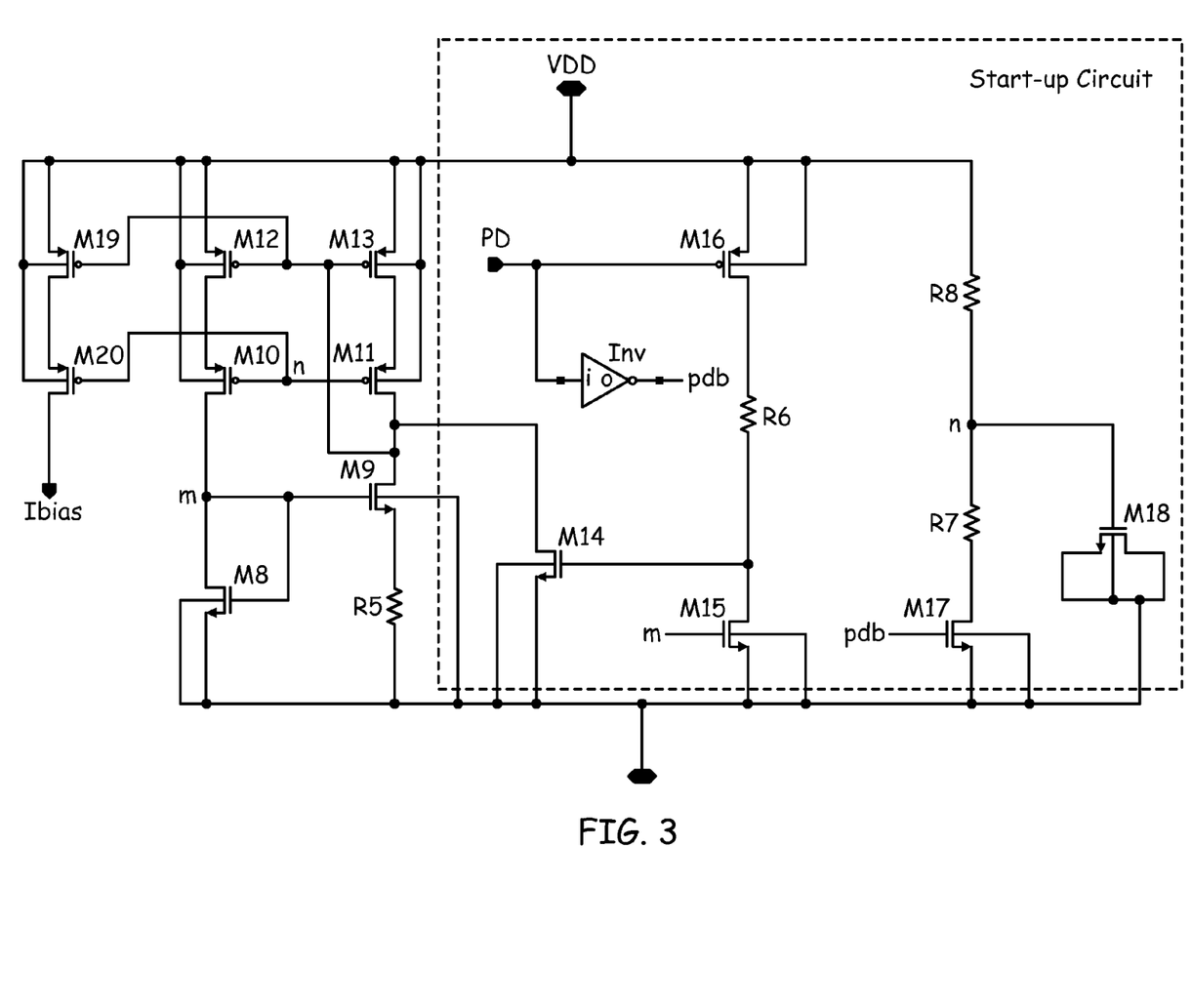
FIG. 3 is a circuit diagram of a bias circuit of a differential crystal oscillator in accordance with the present invention.

FIG. 3 depicts an exemplary bias circuit for generating the bias current Ibias of the differential crystal oscillator of FIG. 2, in accordance with the present invention. The bias circuit includes a start-up circuit formed of transistors M14-M18, resistors R6-R8 and inverter INV and a current-generating circuit formed of transistors M8-M13, transistors M19 and M20 and resistor R5.

Transistor M8, transistor M9 and resistor R5 form a loop, such that the current through resistor R5 is dependent upon the voltage across transistors M8 and M9. In particular, the source terminals of transistors M8 and M9 are coupled in common to $V_{SS}$ through resistor R5, the gate terminals of transistors M8 and M9 are coupled in common, the drain terminal of transistor M8 is coupled to the gate terminal of transistor M9 and the drain terminal of transistor M9 forms the output of the loop. As a result, the current at the output of the loop is equivalent to the current through resistor R5. This current is passed through several current mirrors formed of transistors M10-13 and M19-M20 to the output of the current-generating circuit as Ibias. Thus, the bias current Ibias is proportional to the current across the resistor R5.

The bias circuit of FIG. 3 produces a constant transconductance (gm) across the bias transistor M1 and differential transistors M2 and M3 of FIG. 2, resulting in, for example, $gm_1=K1/R5$ and $gm_2=K2*gm_1$ or $K3/R5$, where $gm_1$ is the transconductance of transistor M1, $gm_2$ is the transconductance of transistor M2 and K1, K2 and K3 are process-dependent parameters. As such, the open-loop voltage gain (A) of the differential crystal oscillator circuit of FIG. 2 is:

$$A = gm_2 * R_3 * \frac{s*R_2*C_1}{1+s*R_2*C_1}. \quad \text{(Equation 1)}$$

Since the frequency of the high pass filter formed by R2 and C1 is designed to be smaller than the oscillation frequency, the frequency response of the high pass filter can be ignored, thus yielding:

$$A \approx \frac{K_3}{R_5} * R_3. \quad \text{(Equation 2)}$$

Therefore, the resulting open-loop gain is constant and independent of $V_{DD}$, temperature and process corners, which in turn, leads to a constant oscillator start-up time.

Figure 4:
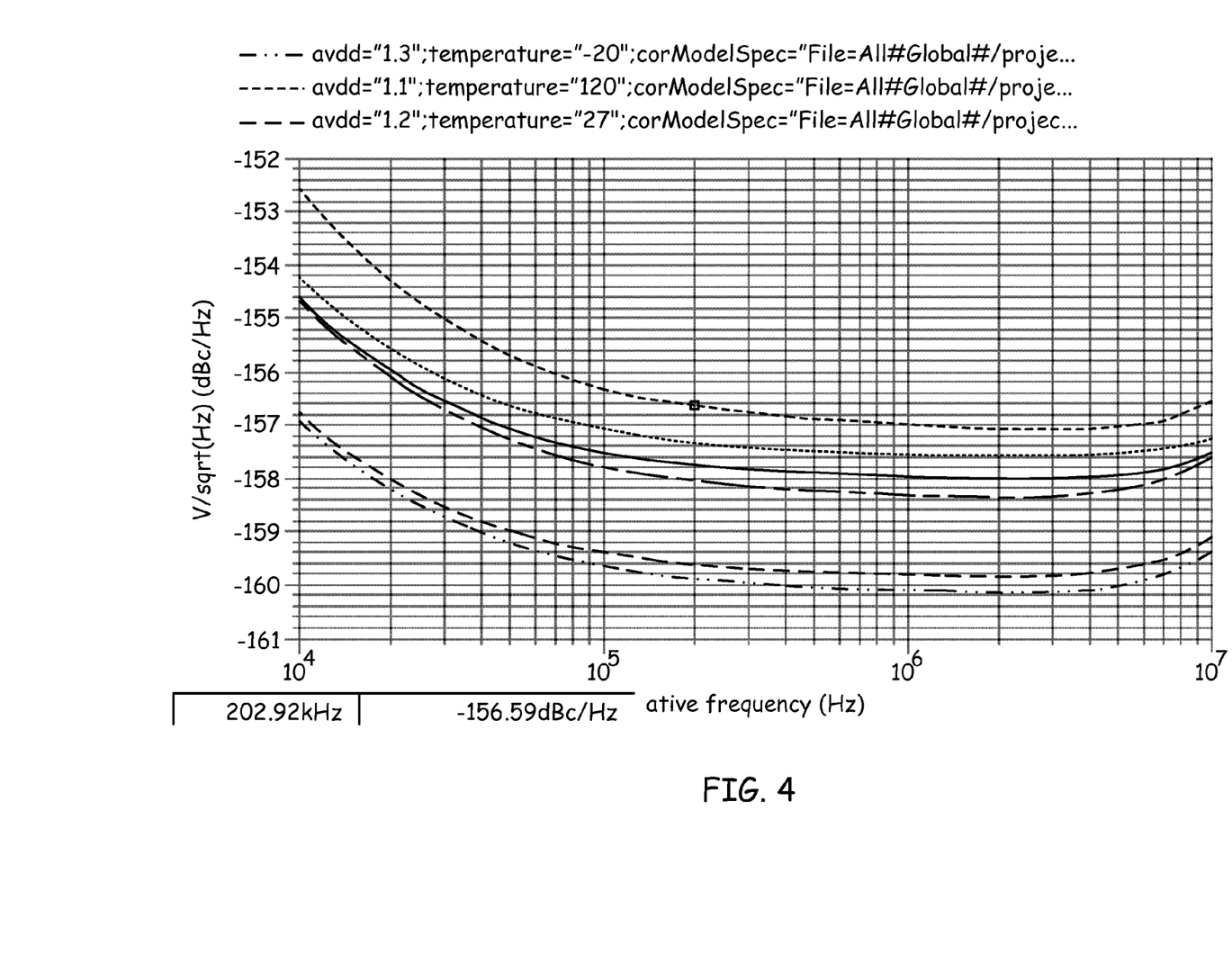
FIG. 4 is a chart illustrating exemplary phase noise simulations of the differential crystal oscillator of the present invention.

FIG. 4 is a chart illustrating exemplary phase noise simulations of the differential crystal oscillator of the present invention. As can be seen in FIG. 4, as the temperature, $V_{DD}$ and process corners vary, the phase noise of the differential crystal oscillator circuit shown in FIGS. 2 and 3 is maintained at sufficiently low levels, i.e., less than −150 dBc/Hz at 10 kHz.

Figure 5:
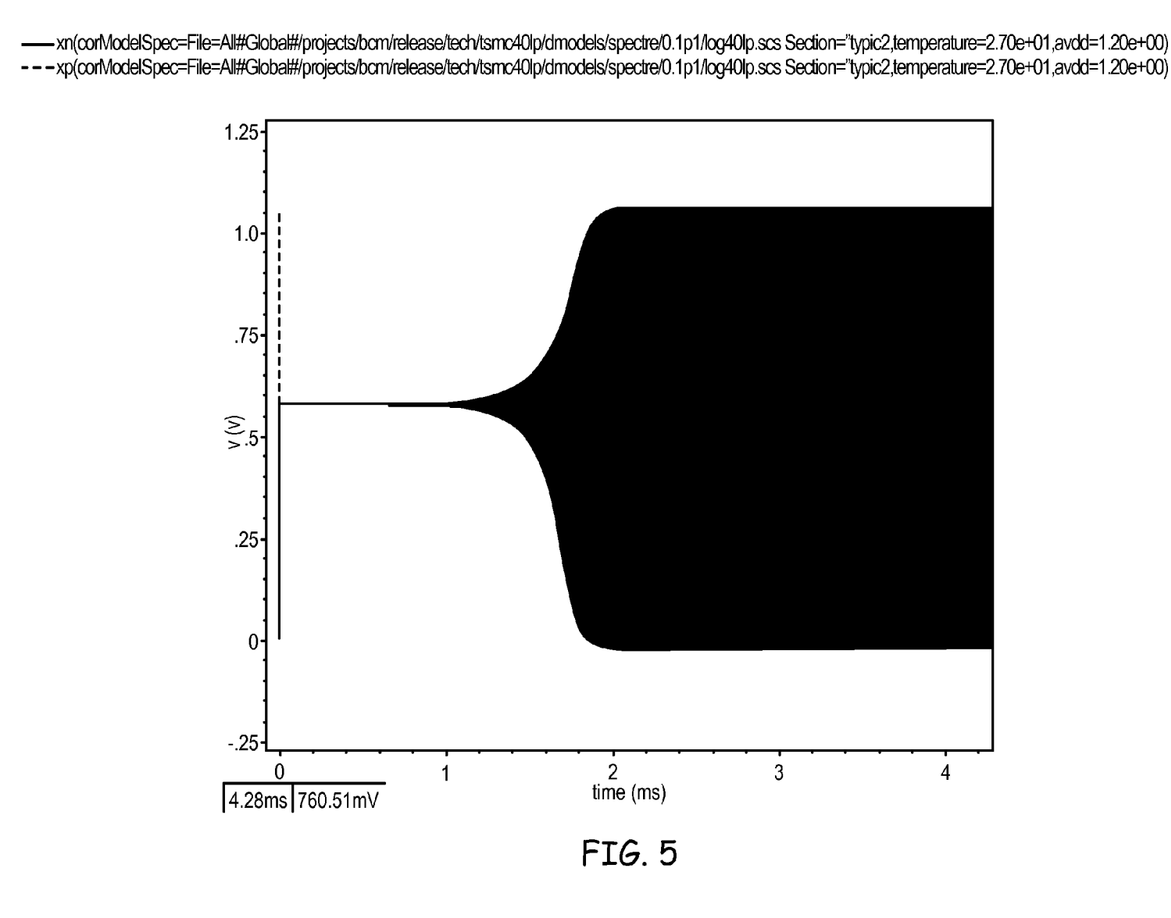
FIG. 5 is a chart illustrating an exemplary start-up time of the differential crystal oscillator of the present invention.

FIG. 5 is a chart illustrating an exemplary start-up time of the differential crystal oscillator of the present invention. As can be seen in FIG. 5, the start-up time of the differential crystal oscillator circuit shown in FIGS. 2 and 3 is less than 3 microseconds, regardless of the temperature, $V_{DD}$ and process corners.

Figure 6:
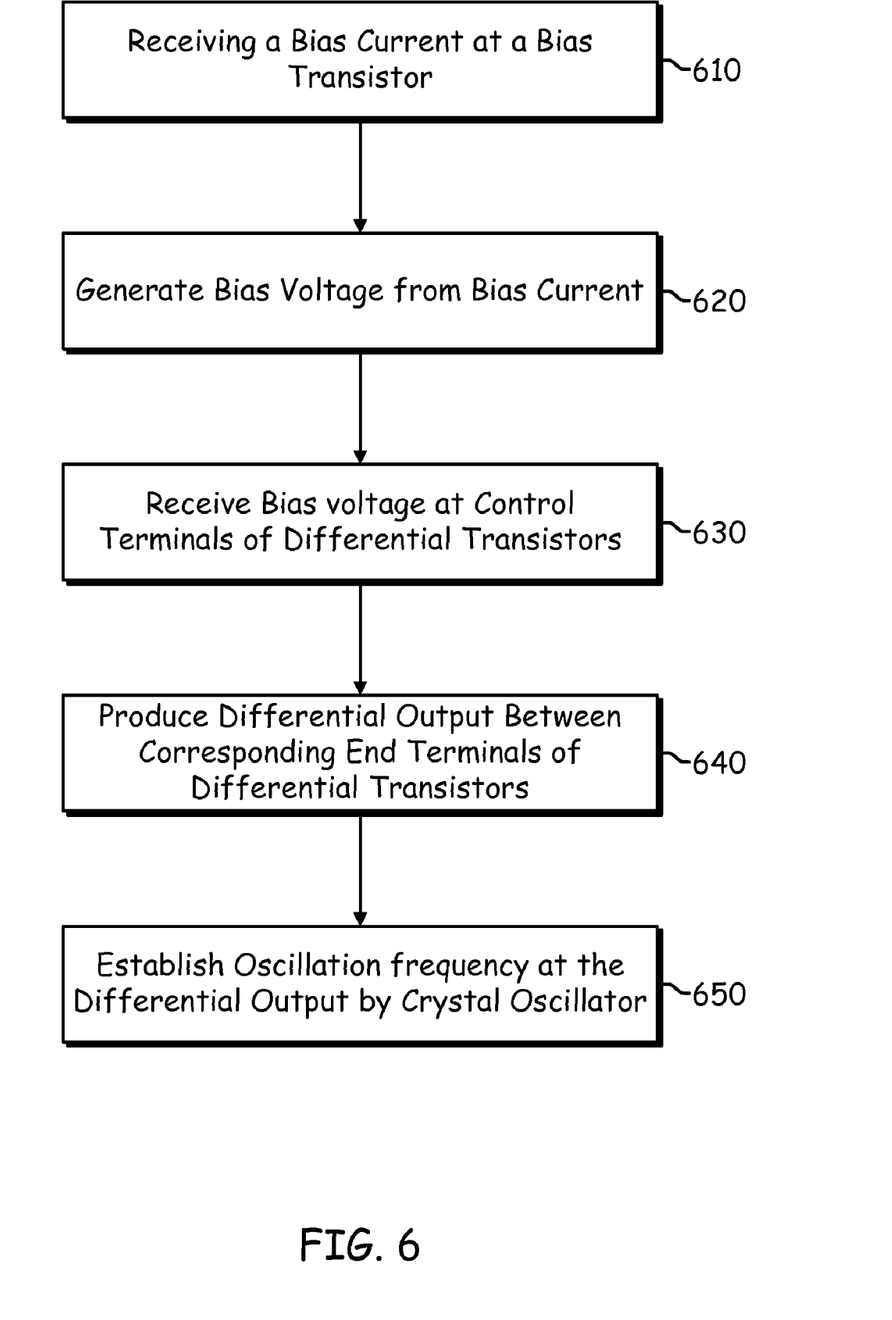
FIG. 6 is a diagram of a method for producing a differential oscillation across a crystal oscillator in accordance with the present invention.

FIG. 6 is a diagram of a method for producing a differential oscillation across a crystal oscillator in accordance with the present invention. The method begins at step 610, where a bias current is received at a bias transistor of a differential crystal oscillator circuit. The method then proceeds to step 620, where a bias voltage is generated from the bias transistor based on the bias current. At step 630, the bias voltage is received at respective control terminals of a differential pair of transistors, and at step 640, a differential output is produced between corresponding end terminals of the differential pair of transistors from the bias voltage. The method ends at step 650, where an oscillation frequency is generated at the differential output via the crystal oscillator.

As may be used herein, the term(s) "coupled to" and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

What is claimed is:

1. A differential oscillator circuit, comprising:
   a bias transistor coupled to receive a bias current and operable to generate a bias voltage based on the bias current;
   a differential pair of transistors, each coupled to receive the bias voltage at a respective control terminal thereof, and operable to produce a differential output between corresponding end terminals thereof; and
   a reference resonating crystal coupled across the differential output to establish an oscillation frequency at the differential output;
   wherein the differential pair of transistors is further coupled to generate a positive feedback in the differential output.

2. The differential oscillator circuit of claim 1, wherein the control terminal of a first transistor of the differential pair of transistors is coupled to an end terminal of a second transistor of the differential pair of transistors and the control terminal of the second transistor is coupled to a corresponding end terminal of the first transistor to produce the positive feedback.

3. The differential oscillator circuit of claim 2, wherein the control terminal of the first transistor is coupled to the end terminal of the second transistor via a first capacitor and the control terminal of the second transistor is coupled to the corresponding end terminal of the first transistor via a second capacitor.

4. The differential oscillator circuit of claim 3, further comprising:
   a first resistor coupled to the first capacitor to form a first high pass filter; and
   a second resistor coupled to the second capacitor to form a second high pass filter;
   wherein the first high pass filter and the second high pass filter operate to remove a DC gain component in the differential output.

5. The differential oscillator circuit of claim 4, wherein the bias transistor has a first end terminal, a second end terminal and a control terminal, the first end terminal being coupled to a supply potential, the second end terminal being coupled to the control terminal to receive the bias current and to generate the bias voltage therefrom, the first end terminal and the control terminal being further coupled to the first and second resistors to pass the bias voltage through the first and second resistors to bias the first and second transistors of the differential pair of transistors.

6. The differential oscillator circuit of claim 5, wherein corresponding first end terminals of the first and second transistors are coupled in common and corresponding second end terminals of the first and second transistors produce the differential output.

7. The differential oscillator circuit of claim 6, further comprising:

first and second control capacitors, each coupled to the second end terminal of one of the first and second transistors, to control the oscillation frequency of the reference resonating crystal.

8. The differential oscillator circuit of claim 1, further comprising:
a control circuit coupled to the differential output to generate a high output impedance across the differential output.

9. The differential oscillator circuit of claim 8, wherein the control circuit includes:
third and fourth transistors having respective corresponding first end terminals coupled to the differential output, respective corresponding second end terminals coupled to an additional supply potential and respective control terminals coupled in common and coupled to each of the first end terminals of the third and fourth transistors through a respective bias resistor.

10. The differential oscillator circuit of claim 9, wherein the control circuit further includes:
fifth and sixth transistors, each coupled between one of the third and fourth transistors and the additional supply potential, for controlling operation of the differential oscillator circuit.

11. The differential oscillator circuit of claim 10, wherein the additional supply potential has an output of 1.2 volts.

12. The differential oscillator circuit of claim 1, wherein the phase noise of the differential oscillator circuit is less than −150 dBc/Hz.

13. The differential oscillator circuit of claim 1, further comprising:
a bias circuit coupled to generate the bias current to produce a constant start-up time of the differential oscillator circuit.

14. The differential oscillator circuit of claim 13, wherein the bias circuit further includes:
a seventh transistor having first and second end terminals and a control terminal, the first end terminal of the seventh transistor being coupled to a source voltage;
an eighth transistor having first and second end terminals and a control terminal, the control terminal of the eighth transistor being coupled to the control terminal of the seventh transistor, the first end terminal of the eighth transistor being coupled in common with the first end terminal of the seventh transistor and to the supply voltage and the second end terminal of the eighth transistor being coupled in common with the second end terminal of the seventh transistor; and
a third resistor coupled to the source voltage and coupled between the first end terminals of the seventh and eighth transistors to form a loop, an output of which generates the bias current at a value proportional to a current across the third resistor.

15. A method for producing a differential oscillation frequency, comprising:
receiving a bias current at a bias transistor;
generating a bias voltage from the bias transistor based on the bias current;
receiving the bias voltage at respective control terminals of a differential pair of transistors;
producing a differential output between corresponding end terminals of the differential pair of transistors;
generating a positive feedback in the differential output via the differential pair of transistors; and
establishing an oscillation frequency at the differential output via a reference resonating crystal.

16. The method of claim 15, wherein the generating the positive feedback further includes:
coupling the control terminal of a first transistor of the differential pair of transmitters to an end terminal of a second transistor of the differential pair of transmitters; and
coupling the control terminal of the second transistor to the corresponding end terminal of the first transistor.

17. The method of claim 16, further comprising:
removing a DC gain component in the differential output by coupling respective capacitors in series with respective resistors between the control terminals of the first and second transistors and the corresponding end terminals thereof.

18. The method of claim 15, further comprising:
generating the bias current to produce a constant start-up time of the differential oscillation.

* * * * *